(12) United States Patent
Matsuo

(10) Patent No.: US 6,897,742 B2
(45) Date of Patent: May 24, 2005

(54) SAW DEVICE USING DIFFERENT COLORS OR IDENTIFIERS TO DISTINGUISH THE FRONT AND BACK OF THE PACKAGE

(75) Inventor: Hiroshi Matsuo, Hokkaido (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 10/297,948

(22) PCT Filed: May 1, 2001

(86) PCT No.: PCT/JP01/03768

§ 371 (c)(1),
(2), (4) Date: Dec. 26, 2002

(87) PCT Pub. No.: WO02/01716

PCT Pub. Date: Jan. 3, 2002

(65) Prior Publication Data

US 2003/0098762 A1 May 29, 2003

(30) Foreign Application Priority Data

Jun. 26, 2000 (JP) ........................................ 2000-191753

(51) Int. Cl.$^7$ ............................. H03H 9/10; H03H 9/42; H03H 9/64
(52) U.S. Cl. .................. 333/150; 333/193; 310/313 R; 310/340; 257/702
(58) Field of Search ............................... 333/150–155, 333/133, 193–196; 310/313 R, 340; 29/827; 361/813; 257/668, 702, 735, 793

(56) References Cited

U.S. PATENT DOCUMENTS 5,905,301 A * 5/1999 Ichikawa et al. ............ 257/676
6,133,067 A * 10/2000 Jeng et al. ................... 438/110
6,518,501 B1 * 2/2003 Kawahara et al. ......... 174/52.4

FOREIGN PATENT DOCUMENTS

JP 176937/1989 U 12/1989
JP 2-25057 * 1/1990 ................... 29/827
JP 38331/1994 U 5/1994

* cited by examiner

Primary Examiner—Barbara Summons
(74) Attorney, Agent, or Firm—Oblon, Spivak, McClelland, Maier & Neustadt, P.C.

(57) ABSTRACT

A surface acoustic wave device applied to a filter, an oscillator, a delay element, or the like has at least a surface acoustic wave element with metal electrodes formed on a piezoelectric substrate to excite surface acoustic waves, a plastic casing base to accommodate the surface acoustic wave element inside a casing, and a plastic cap to seal a hollow in the casing. If the plastic casing base and plastic cap have the same material color, there will be a high risk of misjudging the front and back faces of a plastic package. Providing the plastic casing base and plastic cap with different material colors may reduce inserting direction errors when inserting the surface acoustic wave device into, for example, a printed board.

17 Claims, 2 Drawing Sheets

(a)

(b)

FRONT FACE ⇒          ⇐ BACK FACE (a)

(b)

(c)

SAW DEVICE USING DIFFERENT COLORS OR IDENTIFIERS TO DISTINGUISH THE FRONT AND BACK OF THE PACKAGE

TECHNICAL FIELD

The present invention relates to a surface acoustic wave device, and particularly, to a surface acoustic wave device offering a clear contrast between a plastic casing base and a plastic cap to easily identify the front and back faces of a plastic package.

BACKGROUND ART

Surface acoustic wave devices (SAW devices) utilizing surface acoustic waves that concentrate their energy only at the surfaces of crystalline substrates involve propagation velocities slower than electromagnetic waves by about $10^{-5}$, and the devices can be downsized. Accordingly, they are recently applied to filters, oscillators, delay elements, and the like in broad fields including TVs, VTRs, and communications equipment. Among them, the surface acoustic wave devices are widely used for video frequency filters, etc., typically applied to TVs and VTRs.

A surface acoustic wave device for video consists of a surface acoustic wave element with metal electrodes formed on a piezoelectric substrate to excite surface acoustic waves and a plastic package with a lead frame to realize miniaturization, light weight, and work rationalization. The plastic package is made of a plastic casing base and a plastic cap. The plastic casing base is integrally formed with the lead frame that is inserted into the casing and has a die pad part on which the surface acoustic wave element is mounted and bonding pad parts. The die pad part is positioned within the casing of the plastic base and to which the surface acoustic wave element is bonded with an adhesive. The surface acoustic wave element is electrically connected to the bonding pad parts with wire bonding. In a last assembling process, the plastic cap is fixed to the plastic casing base with an adhesive, to close the inside of the casing.

However, the surface acoustic wave device employing the conventional plastic package has a below-mentioned problem. Namely, the conventional plastic package employs thermosetting epoxy resin to meet a SAW filter packaging quality. Generally, a material color of the epoxy resin is mainly black. Accordingly, when the plastic cap and plastic casing base are assembled into the plastic package, they have the same color tone to hardly identify the front and back faces of the surface acoustic wave device. Conventionally, the plastic cap and plastic casing base are provided with slightly different plan shapes to distinguish them from each other, or they are distinguished from each other according to a manufacturer name, production number, etc., printed thereon. They, however, are insufficient as clarification standards and involve a risk of misjudging the front and back faces.

In particular, when the plastic package is inserted into a printed board and the like, it is necessary to identify the front and back faces of the plastic package by directly looking at the same from a top-face direction. Namely, the front and back faces are judged from a side view of the plastic package. Accordingly, the clarification standards such as the slight difference between the front and back shapes and the printing are useless, and inserting direction errors frequently occur.

DISCLOSURE OF INVENTION

The present invention is to solve the above-mentioned problem, and an object thereof is to provide a surface acoustic wave device with a plastic package having easily distinguishable front and back faces.

Another object of the present invention is to provide a surface acoustic wave device with a plastic package having front and back faces that are distinguishable when seen from a top-face direction.

In order to accomplish the objects, the present invention is characterized by a surface acoustic wave device having a surface acoustic wave element with metal electrodes formed on a piezoelectric substrate to excite surface acoustic waves, a plastic casing base to accommodate the surface acoustic wave element inside a casing, and a plastic cap to seal a hollow within the casing. The plastic casing base and plastic cap have different material colors.

Namely, the surface acoustic wave device has the surface wave acoustic element having the piezoelectric substrate and the metal electrodes arranged on the surface of the piezoelectric substrate to excite surface acoustic waves, a lead frame, and the plastic package. The lead frame has a die pad part to which the surface acoustic wave element is bonded, bonding pad parts extended from the die pad part and electrically connected to the surface acoustic wave element, and lead parts electrically connected to the bonding pad parts and electrically connected to the outside of the device. The plastic package has the plastic casing base provided with a mounting face where the die pad part and bonding pad parts are arranged and a side wall part rising from the periphery of the mounting face, and the plastic cap bonded to a top bonding face of the side wall part. The plastic casing base and plastic cap have different material colors.

Here, the plastic casing base has the side wall part formed from the periphery of the mounting face, and therefore, the die pad part, bonding pad parts, and surface acoustic wave element bonded to the die pad part are arranged in the casing of the plastic casing base. The plastic cap is bonded to the bonding face at the top end of the side wall part, to confine the die pad part, bonding pad parts, and surface acoustic wave element in a hollow between the plastic casing base and the plastic cap.

According to the characteristic of the present invention, the plastic casing base and plastic cap covering all parts but the lead parts have different exterior colors to provide a clear contrast between the plastic casing base and the plastic cap. Without depending on a difference between the plan shapes of the plastic casing base and plastic cap, or a judging standard such as a manufacturer name printed thereon, one can easily identify the front and back faces of the surface acoustic wave device by viewing it.

According to the characteristic of the present invention, the "material colors" are the colors of materials themselves of the plastic casing base and plastic cap, or those of pigments contained in the materials of the plastic casing base and plastic cap. For example, the plastic casing base and plastic cap may be made of thermosetting epoxy resin. In this case, the thermosetting epoxy resin itself is transparent and colorless, and therefore, the colors of pigments contained therein correspond to the "material colors." Employing different material colors for the plastic casing base and plastic cap may eliminate a coloring process on the plastic casing base and plastic cap. Usually, the plastic package such as the plastic casing base and plastic cap is made of black thermosetting epoxy resin, and therefore, any one of the plastic casing base and plastic cap may employ a material color other than black offering a clear contrast relative to black. For example, the plastic casing base may have a material color of black and the plastic cap a material color of blue, to provide a clear contrast between the plastic cap and the plastic casing base in the assembled package.

The bonding face is preferably arranged in parallel with the mounting face. When the surface acoustic wave device is mounted on, for example, a printed board by inserting the lead parts therein, the mounting face parallel to the lead parts may be positioned perpendicular to the printed board. In this case, the bonding face of the plastic cap and plastic casing base is in parallel with the mounting face, and therefore, both the plastic cap and plastic casing base partly appear on a side face of the plastic package. Since the plastic cap and plastic casing base have different color tones, seeing the surface acoustic wave device from a top-face direction, i.e., viewing a side face of the plastic package is sufficient to distinguish the plastic cap and plastic casing base from each other. Accordingly, when mounting the surface acoustic wave device or after the mounting thereof, one can easily identify the front and back faces of the surface acoustic wave device, thereby suppressing package inserting direction errors.

Material of the plastic casing base and plastic cap is preferably thermosetting epoxy resin.

BRIEF DESCRIPTION OF DRAWINGS

FIG. 1(*b*) is a sectional view taken along a section shown in FIG. 1(*a*);

FIG. 2(*b*) is an exterior view showing a back face of the surface acoustic wave device; and FIG. 2(*c*) is an exterior view showing a side face opposite to a side face of a plastic package 3 from which lead parts 8 are extended.

BEST MODE FOR CARRYING OUT THE INVENTION

Figure 1:
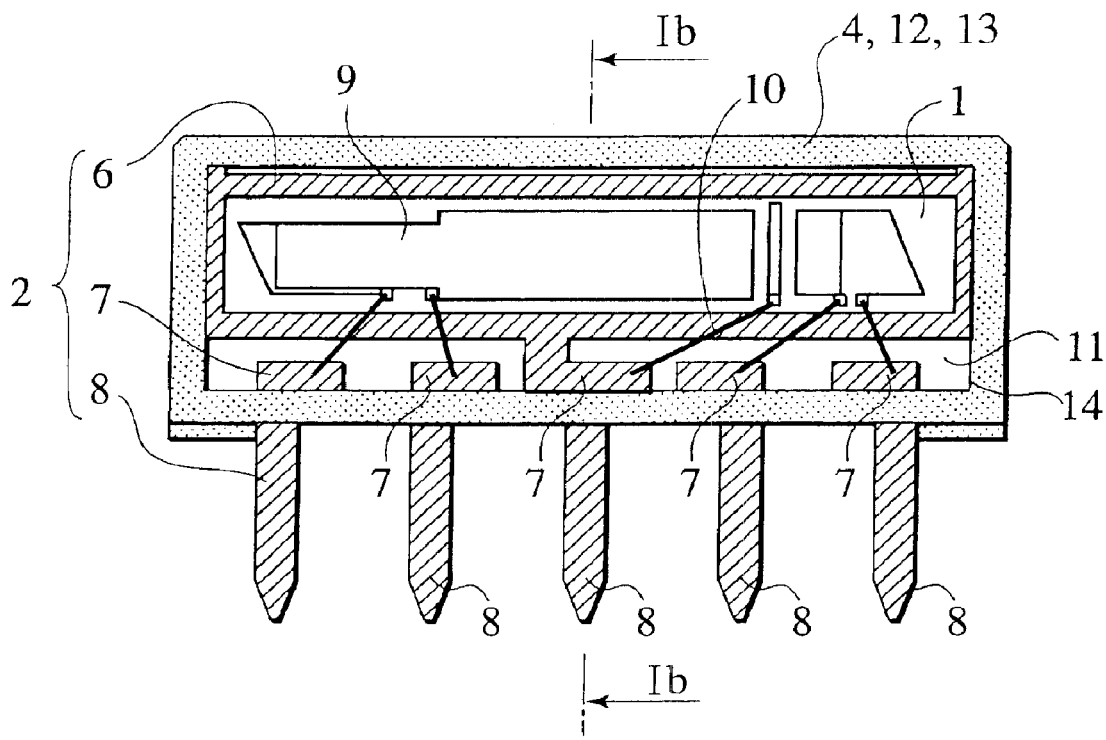
FIG. 1(*a*) is a plan view showing a structure of a surface acoustic wave device according to an embodiment of the present invention.
Figure 1:
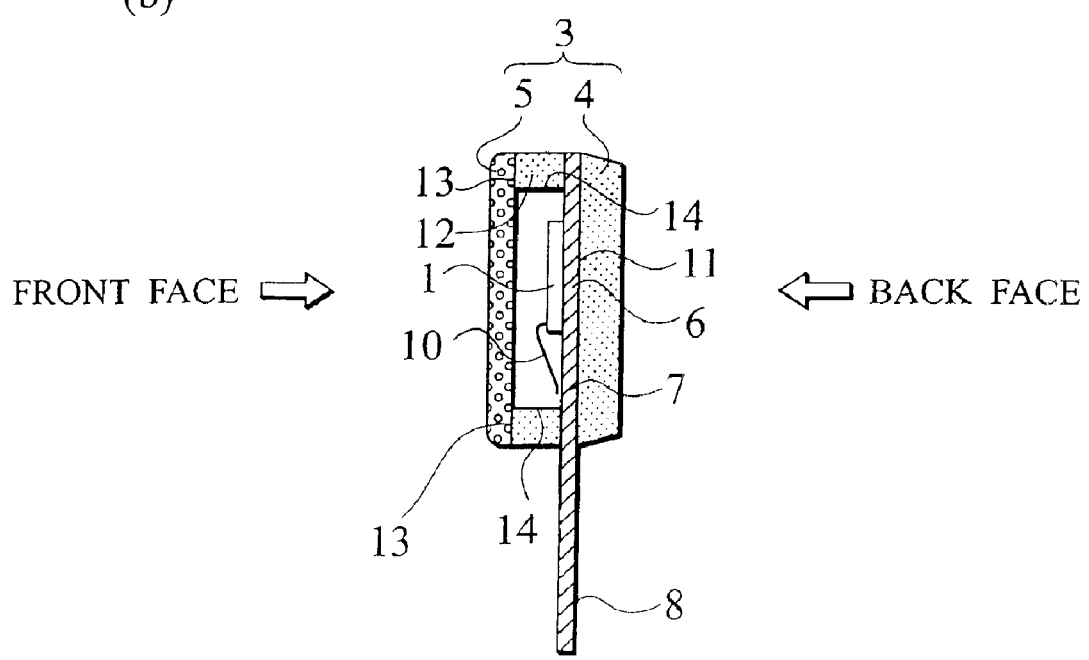

A best mode of implementation of the present invention will be explained with reference to the drawings. FIG. 1(*a*) is a plan view showing a structure of a surface acoustic wave device according to an embodiment of the present invention. As shown in FIG. 1(*a*), the surface acoustic wave device according to the embodiment of the present invention has a surface acoustic wave element 1, a lead frame 2, and a plastic package 3 made of thermosetting epoxy resin.

The surface acoustic wave element 1 has a piezoelectric substrate and metal electrodes 9 arranged on the surface of the piezoelectric substrate to excite surface acoustic waves. The piezoelectric substrate is a lithium tantalate ($LiTaO_3$) substrate, a lithium niobate ($LiNbO_3$) substrate, a lithium barate ($LiB_4O_7$) substrate, or a piezoelectric substrate made of, for example, crystal and sapphire. The metal electrodes 9 have comb-teeth shapes mating with each other (not shown) and are made of aluminum (Al) or an alloy of Al added with a minute quantity of other metal such as copper (Cu) and silicon (Si).

The lead frame 2 is made of a conductive copper alloy plate of 100 to 400 $\mu$m thick and serves as a framework of the plastic package. The lead frame 2 has a die pad part 6 to which the surface acoustic wave element 1 is bonded, a plurality of bonding pad parts 7 electrically connected to the surface acoustic wave element 1 with gold bonding wires 10, and a plurality of lead parts 8 electrically connected to an external system such as a printed board. The surface acoustic wave element is bonded to the die pad part 6 with a thermosetting adhesive.

The plastic package 3 has a black plastic casing base 4 integrally formed with the lead frame 2 and a blue plastic cap. The black plastic casing base 4 has a mounting face 11 where the die pad part 6 and bonding pad parts 7 are arranged and a side wall part 12 rising from a periphery 14 of the mounting face 11. In FIG. 1(*a*), the blue plastic cap is not shown.

FIG. 1(*b*) is a sectional view taken along a section shown in FIG. 1(*a*). As shown in FIG. 1(*b*), the side wall part 12 is substantially perpendicular to the mounting face 11, and the black plastic casing base 4 is integral with the lead frame 2. The surface acoustic wave element 1, die pad part 6, and bonding pad parts 7 are arranged on the mounting face 11, are surrounded with the side wall part 12, and are accommodated in a casing of the black plastic casing base 4. At the top end of the side wall part 12, there is a bonding face 13 in parallel with the mounting face 11. To the bonding face 13, the plate-like blue plastic cap 5 is bonded with a thermosetting adhesive, thereby closing and sealing the inside of the casing and enclosing the die pad part 6, bonding pad parts 7, and surface acoustic wave element 1 in a hollow between the black plastic casing base 4 and the blue plastic cap 5. The lead parts 8 are extended outside the plastic package 3 from a side face of the plastic package 3 and are arranged in parallel with the mounting face 11.

Here, the side of the mounting face 11 where the surface acoustic wave element 1 is die-bonded is called the "front face" and the side opposite to the mounting face 11 is called the "back face." Therefore, FIG. 1(*a*) is a plan view showing the front face of the surface acoustic wave device, and FIG. 1(*b*) is a sectional view showing a side face relative to the front and back faces. The black plastic casing base 4 and blue plastic cap 5 have different material colors. In this example, the black plastic casing base 4 has a black color and the blue plastic cap 5 has a blue color. The color of the thermosetting epoxy resin forming the plastic package 3 is not black. Usually, black pigments are contained in the resin to provide the plastic package 3 with a black color. Accordingly, usual black pigments are contained in the black plastic casing base 4, and blue pigments instead of the black pigments are contained in the blue plastic cap 5.

Figure 2:
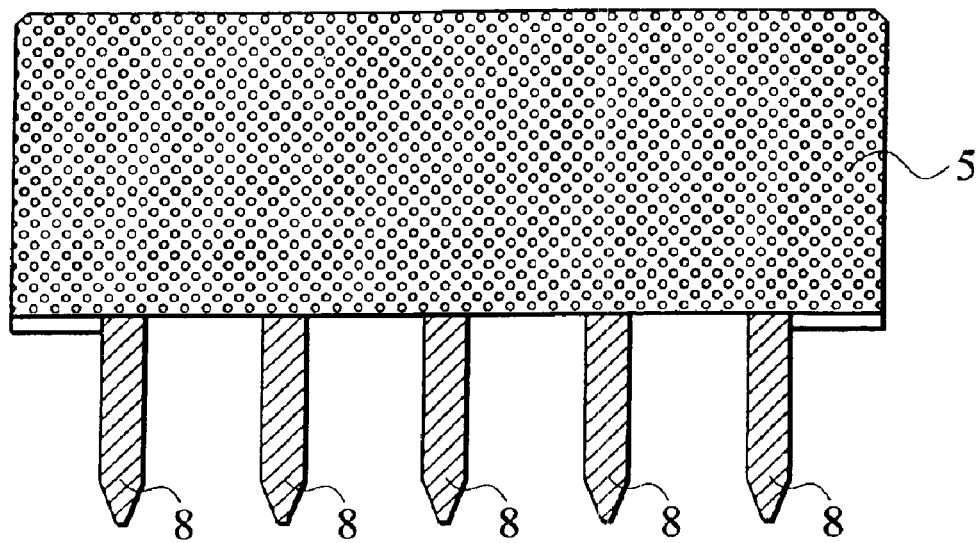
FIG. 2(*a*) is an exterior view corresponding to FIG. 1(*a*), showing a front face of the surface acoustic wave device.
Figure 2:
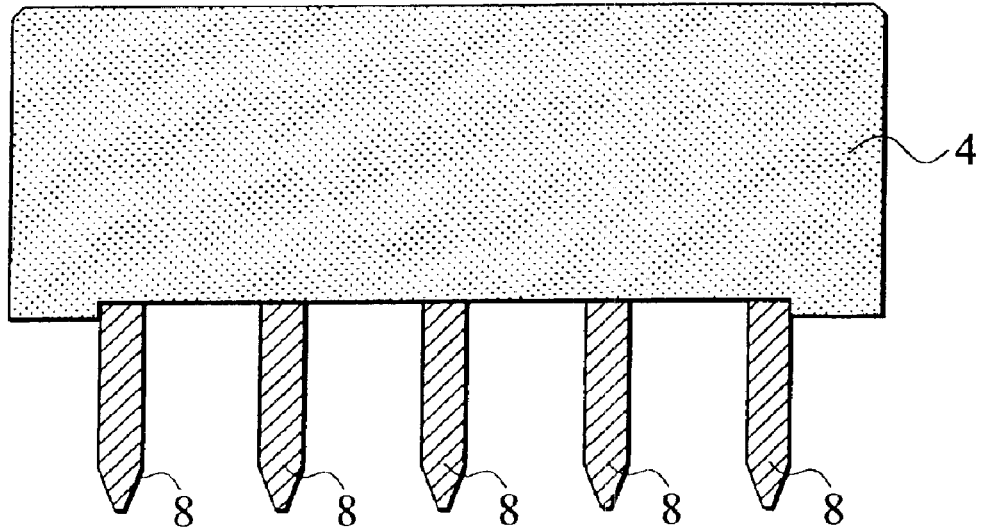
Figure 2:
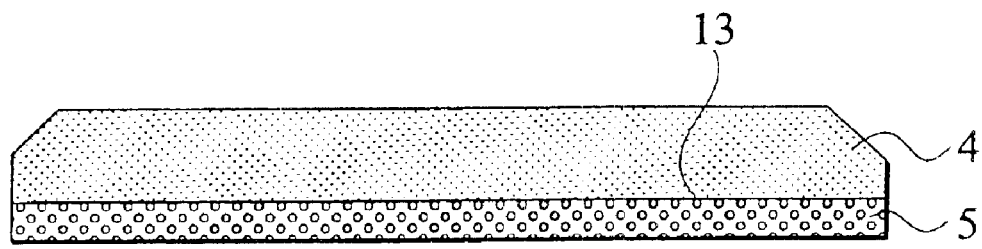

FIG. 2(*a*) corresponds to FIG. 1(*a*) and is an exterior view showing the front face of the surface acoustic wave device. In FIG. 1(*a*), the blue plastic cap 4 is not shown. In FIG. 2(*a*), the blue plastic cap 5 is bonded to the bonding face 13 of the black plastic casing base 4. To show the material color difference appearing on the exterior of the black plastic casing base 4 and blue plastic cap 5, hatch patterns used in FIGS. 1(*a*) and 1(*b*) are employed in FIG. 2(*a*). The same is applied to FIGS. 2(*b*) and 2(*c*) to be explained later.

As shown in FIG. 2(*a*), an exterior view of the front face of the surface acoustic wave device mainly shows the blue plastic cap 5 and lead parts 8. FIG. 2(*b*) is an exterior view showing the back face of the surface acoustic wave device. As shown in FIG. 2(*b*), the exterior view of the back face of the surface acoustic wave device mainly shows the black plastic casing base 4 and lead parts 8. Employing different material colors for the black plastic casing base 4 and blue plastic cap 5 allows one to easily judge that the side where the blue plastic cap 5 appears is the front face and the side where the black plastic casing base 4 appears is the back face. Namely, the front and back faces of the surface acoustic wave device are distinguishable according to the material colors of the black plastic casing base 4 and blue plastic cap 5.

FIG. 2(*c*) is an exterior view showing a side face opposite to the side face of the plastic package 3 from which the lead parts 8 are extended. This is called a top exterior view. As shown in FIG. 2(*c*), the bonding face 13 between the black plastic casing base 4 and the blue plastic cap 5 is arranged in parallel with the mounting face 11, and therefore, both the black plastic casing base 4 and blue plastic cap 5 partly appear on the side face of the plastic package 3, i.e., the top face of the plastic package 3.

As explained above, according to the embodiment of the present invention, the blue plastic cap 5 and the black plastic casing base 4 covering the components excluding the lead parts 8 have different material colors, to provide a clear contrast between the black plastic casing base 4 and the blue plastic cap 5. As a result, without depending on a difference between the plan shapes of the black plastic casing base 4 and blue plastic cap 5, or a judgment standard such as a manufacturer name printed thereon, one can easily identify the front and back faces of the surface acoustic wave device by seeing it.

When the surface acoustic wave device is mounted on, for example, a printed board by inserting the lead parts 8 therein, the mounting face 11 is in parallel with the lead parts 8, and therefore, the mounting face 11 is positioned perpendicular to the printed board. At this time, both the black plastic casing base 4 and blue plastic cap 5 partly appear on a side face of the plastic package 3. In addition, the black plastic casing base 4 and blue plastic cap 5 have different color tones. Accordingly, by seeing the surface acoustic wave device from a side face thereof, i.e., by seeing a side-face appearance of the plastic package 3, one can easily identify the black plastic casing base 4 and blue plastic cap 5. When mounting the surface acoustic wave device or after the mounting thereof, one can easily distinguish the front and back faces thereof from each other, thereby suppressing package inserting direction errors.

According to the embodiment of the present invention, the plastic casing base is black and the plastic cap blue. Instead, the plastic casing base may be blue and the plastic cap black. Further, any combination of colors other than black and blue, providing a clear contrast is acceptable.

What is claimed is:

1. A surface acoustic wave device comprising:
    a surface acoustic wave element comprising metal electrodes formed on a piezoelectric substrate, the wave element configured to excite surface acoustic waves;
    a plastic casing base to accommodate the surface acoustic wave element inside a casing; and
    a plastic cap to seal a hollow in the casing,
    wherein material colors of the plastic casing base and plastic cap differ from each other, and
    wherein portions of the plastic casing base and the plastic cap are disposed on a side face of the device.

2. A surface acoustic wave device comprising:
    a surface acoustic wave clement comprising a piezoelectric substrate and metal electrodes arranged on a surface of the piezoelectric substrate, the wave element configured to excite surface acoustic waves;
    a lead frame comprising a die pad part to which the surface acoustic wave element is bonded, bonding pad parts extending from the die pad part and electrically connected to the surface acoustic wave element, and lead parts electrically connected to the bonding pad parts and electrically connected to an outside of the device;
    a plastic casing base formed integrally with the lead frame, the plastic casing comprising a mounting face on which the die pad part and bonding pad parts are arranged and a side wall part extending from a periphery of the mounting face; and
    a plastic cap disposed on a bonding face at a top end of the side wall part,
    wherein the plastic casing base and plastic cap comprise different material colors, and
    wherein portions of the plastic casing base and the plastic cap are disposed on a side face of the device which is perpendicular to the mounting face.

3. The surface acoustic wave device of claim 2, wherein the bonding face is disposed parallel to the mounting face.

4. The surface acoustic wave device of claim 2, wherein material of the plastic casing base and plastic cap comprises thermosetting epoxy resin.

5. An acoustic wave device comprising:
    a casing having a bottom face and a casing side face extending from the bottom face to define a void, the casing having a first color on at least a portion of the bottom and casing side faces;
    a wave element configured to excite an acoustic wave, the wave element disposed in the void; and
    a cap having a top face and a cap side face extending from the top face, the cap disposed on the casing to close the void, the cap having a second color different from the first color on at least a portion of the top and cap side faces, the casing and cap side faces defining an exterior side surface of the device.

6. The acoustic wave device according to claim 5, wherein the casing has the first color on substantially an entirety of each of the bottom and casing side faces.

7. The acoustic wave device according to claim 5, wherein the cap has the second color on substantially an entirety of each of the top and cap side faces.

8. The acoustic wave device according to claim 7, wherein the casing has the first color on substantially an entirety of each of the bottom and casing side faces.

9. The acoustic wave device according to claim 5, wherein one of the casing and the cap comprises a plastic material.

10. The acoustic wave device according to claim 5, wherein the first and second colors contrast with one another.

11. The acoustic wave device according to claim 5, wherein the wave element comprises a piezoelectric substrate and at least one electrode electrically connected to the substrate.

12. The acoustic wave device according to claim 5, wherein the cap is bonded to the casing.

13. An acoustic wave device comprising:
    a casing having a bottom face and a casing side face extending from the bottom face to define a void, the casing having a first identifier disposed on at least a portion of the bottom and casing side faces;
    a wave element configured to excite an acoustic wave, the wave element disposed in the void; and
    a cap having a top face and a cap side face extending from the top face, the cap disposed on the casing to close the void, the cap having a second identifier different from the first identifier disposed on at least a portion of the top and cap side faces, the casing and cap side faces defining an exterior side surface of the device.

14. The acoustic wave device according to claim 13, wherein the first identifier comprises a first color, and the second identifier comprises a second color different from the first color.

15. The acoustic wave device according to claim 14, wherein the first color contrasts with the second color.

16. The acoustic wave device according to claim 15, wherein the wave element comprises a surface acoustic wave element configured to excite surface acoustic waves.

17. The acoustic wave device according to claim 16, wherein the casing has the first color on substantially an entirety of each of the bottom and casing side faces, and the cap has the second color on substantially an entirety of each of the top and cap side faces.

* * * * *